SEMICONDUCTOR RECTIFIER

Filed April 30, 1953

INVENTOR.
LAWRENCE J. GIACOLETTO

BY J. L. Whittaker
ATTORNEY

United States Patent Office 2,702,360

Patented Feb. 15, 1955

2,702,360

SEMICONDUCTOR RECTIFIER

Lawrence J. Giacoletto, Princeton Junction, N. J., assignor to Radio Corporation of America, a corporation of Delaware Application April 30, 1953, Serial No. 352,225

3 Claims. (Cl. 317—234)

This invention pertains to rectifiers and particularly to junction type semiconductor rectifiers comprising a plurality of individual units combined in a unitary structure.

It is well known in the electronics arts, for example in the manufacture of batteries, rectifiers and the like to combine a plurality of individual units into a single structure to provide, for example, more current or voltage output, or greater current handling capacity than any one of the units can provide by itself. A semiconductor rectifier of the P-N junction type comprises a body of semiconductor material including a zone of one type of conductivity and having a zone of opposite type conductivity material separated from the first mentioned zone by a rectifying barrier. One characteristic of the P-N junction is its ability to pass current easily in one direction but not in the opposite direction. Thus a signal applied across a P-N junction may be rectified thereby.

As, in the types of devices described above, it is desirable to provide a plurality or stack of P-N junction type rectifiers in order to provide a device having all of the advantages of a single P-N junction rectifier and the large voltage handling capacity of a stack of such devices connected in series. Previously it has been found difficult to prepare a stack of P-N junction rectifiers simply and economically having a high degree of uniformity between the individual units in the stack.

Accordingly, an important object of this invention is to provide a P-N junction type rectifier of new and improved form.

Another object is to provide a stacked P-N junction type rectifier device comprising a plurality of individual rectifier units which are substantially uniform in structure and characteristics.

In general, the purposes and objects of this invention are accompilshed by arranging a plurality of wafers of semiconductor material with a metal disk or plate between each wafer. The metal disks are coated on one side with a layer of impurity material capable of alloying with the semiconductor body to form a P-N junction. The other surface of the metal disk is provided with a layer of material containing an impurity of the class of impurity found in the semiconductor body itself. The metal discs are thus positioned so that the impurity layers capable of forming P-N junctions are in contact with the corresponding surface of each semiconductor body and the other layers of impurity material are in contact with the opposite corresponding surface of each semiconductor body. Thus each body has a layer of one type of impurity material in contact with one surface thereof and a layer of another type of impurity material in contact with the opposite surface. The assembled device is heated to form a P-N junction with one of the layers of impurity material. The other layer of impurity material bonds the metal plate to the semiconductor body in non-rectifying contact.

The invention is described in greater detail with reference to the drawing wherein.

Similar elements are designated by similar reference numerals throughout the drawing.

Figures 1, 2, 3:
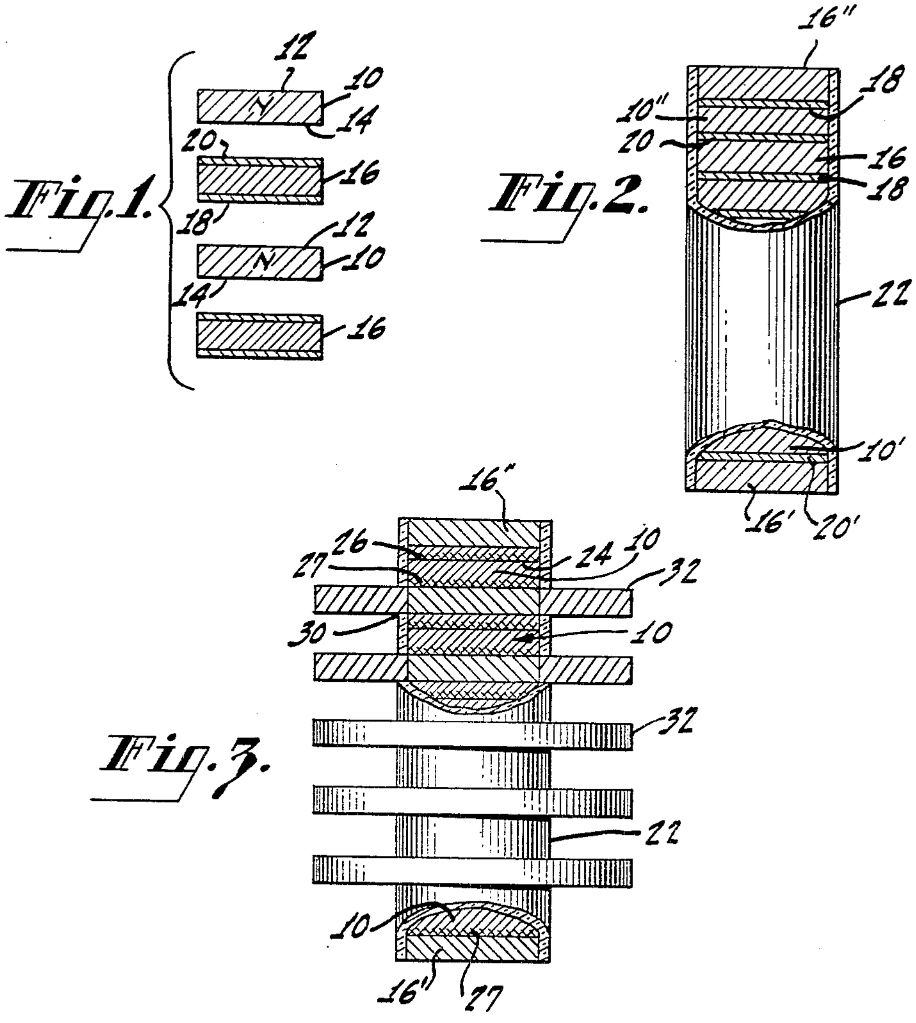
Fig. 1 is an exploded sectional elevational view of a plurality of individual units comprising the device of the invention.
Fig. 2 is a fragmentary sectional elevational view of the elements in Fig. 1 assembled and awaiting further treatment; and, Fig. 3 is a sectional elevational view of a portion of a completed stacked rectifier made according to the principles of the invention.

Referring to Figure 1, a stacked rectifier prepared according to the invention comprises a plurality of wafers or crystals 10 of semiconductor material having two substantially planar parallel surfaces 12 and 14. The crystals 10 may be in the form of disks or they may have a rectangular or any other suitable cross-section. The semiconductor material of the crystals may be any impurity type semiconductor such as silicon or germanium of either N-type or P-type conductivity. For the purposes of this description, the semiconductor bodies or wafers will be assumed to be of N-type germanium. The semiconductor bodies or wafers are prepared in conventional fashion, including conventional surface treatment as is well known in the art, and may be of the order of two mils thick. Each body or crystal is separated from the next by a metal disk or plate 16, for example of nickel or the like, of the same general size and shape as the semiconductor bodies 10. Each plate has a layer of a particular substance on each surface thereof. One layer 18 comprises a so-called impurity material capable of alloying with the semiconductor crystal to form a P-N junction. With a body 10 of N-type germanium such an impurity material may comprise one or more acceptor substances such as indium, aluminum, gallium, boron or zinc. If the semiconductor crystal is of P-type conductivity, the impurity material may comprise one or more donor substances such as arsenic, bismuth, antimony, sulfur selenium, tellurium or phosphorus. The other layer of material 20 on the opposite surface of the nickel plate 16 is a solder material suitable for forming a non-rectifying contact with the semiconductor crystal 10. Thus the material of the layer 20 may be selected from the same class of impurity, donor or acceptor, contained within the semiconductor crystal and which endows the crystal with its characteristic conductivity. Thus, the layer 20 may also be one or more of the appropriate acceptor or donor materials listed above, the material selected being determined by the conductivity type of the crystal 10. The material preferred for the first mentioned layer 18 is indium and that preferred for the second layer 20 is antimony when the semiconductor body 10 is of N-type germanium. The layers 18 and 20 may be of any convenient size and may range from small dots to disks having the same diameter as the plates 16.

In the preparation of the stacked rectifier of the invention, referring to Figure 2, the various parts described above are assembled within an insulating cylinder 22 of ceramic, high melting-point glass or the like which forms a supporting and confining sheath for the individual components. The bottom crystal of germanium 10′ rests on a nickel plate 16′ having only the layer 20′ of N-type impurity material on the surface in contact with the crystal. The top germanium crystal 10″ is covered by a nickel plate 16″ having only a layer of P-type material on the surface in contact with the crystal. After the various components have been assembled in the cylinder 22, the entire unit is heated in order to alloy the indium with the germanium to form the P-N junctions as shown in Figure 3. Such a procedure may be carried out generally according to the teachings of C. W. Mueller in his U. S. patent application, Serial Number 295,304, filed June 24, 1952 and assigned to the assignee of this application. The P-N junction formed by this procedure comprises a rectifying barrier 24 and a thin layer 26 of P-type germanium. The material 28 adjacent to the P-type layers is essentially an alloy of indium and germanium.

Generally, according to such a procedure, the assembled device is inserted in an oven and heated at a temperature of the order of 550° C. for a time of the order of 10 minutes. Such a procedure is sufficient to cause the indium layers 18 to alloy with the germanium bodies 10 to form the rectifying barriers 24 and layers of P-type material 26. The same heating operation causes the antimony layers 20 to melt and bond the nickel plates 16 to the corresponding surfaces 14 of the germanium crystals 10 with which they are in contact. The nickel plates are thus bonded to the germanium in good, non-rectifying contact by means of a layer 27 of somewhat more N-type material. Thus each nickel plate serves both as an electrode connection to the portions 28 of the P-N junctions to which they are bonded and as base or non-rectifying electrode for adjacent crystals. It is to be understood that other procedures or firing schedules may be employed for forming the P-N junction and bonding the metal plates 16. In addition, other solder materials may be used to form the ohmic contact between each plate 16 and the crystal 10 above it.

If desired, slots 30 may be provided in the insulating sheath 22 by which electrical contact may be made to one or more of the nickel plates 16 by means of projecting fins 32 connected thereto. The fins 32 may provide cooling of the device as well as electrical contact.

As an alternative procedure according to the invention, after the heating operation has accomplished the desired alloying, the rectifier unit may be removed from the insulating sheath 22 and may be potted in an insulating medium such as a wax or the like. Thus the sheath 22 may be utilized again in the process of preparing another rectifier.

What is claimed is:

1. An electrical device comprising a stack of semiconductor bodies, each of said bodies including a P-type portion and an N-type portion separated by a P-N rectifying barrier, said bodies being separated by metal electrodes, each of said electrodes being integrally bonded to the P-type portion of the body on one side thereof and the N-type portion of the body on the other side thereof.

2. An electrical device comprising a stack of semiconductor bodies, each of said bodies including a P-type portion and an N-type portion separated by a P-N rectifying barrier, said bodies being separated by metal electrodes, each of said electrodes being integrally bonded to the P-type portion of the body on one side thereof and the N-type portion of the body on the other side thereof, and an insulating sheath surrounding all of said bodies and electrodes.

3. A multi-element P-N junction rectifier comprising a plurality of stacked bodies of semiconductor material, each of said bodies including a P-type portion and an N-type portion separated by a P-N rectifying barrier, and a non-rectifying electrode bonded to a corresponding one of said portions of each of said bodies by a material containing an impurity substance of the type utilized to impart to said bonded portion its characteristic type of conductivity.

References Cited in the file of this patent

UNITED STATES PATENTS

| | | |
|---|---|---|
| 2,524,270 | Pelfrey | Oct. 3, 1950 |
| 2,644,852 | Dunlap | July 7, 1953 |